United States Patent
Vetter (10) Patent No.: US 8,911,867 B2
(45) Date of Patent: Dec. 16, 2014

(54) PROTECTIVE COATING, A COATED MEMBER HAVING A PROTECTIVE COATING AS WELL AS METHOD FOR PRODUCING A PROTECTIVE COATING

(75) Inventor: Jörg Vetter, Bergisch-Gladbach (DE)

(73) Assignee: Oerlikon Metaplas GmbH, Bergisch-Gladbach (DE)

( * ) Notice: Subject to any disclaimer, the term of this patent is extended or adjusted under 35 U.S.C. 154(b) by 115 days.

(21) Appl. No.: 13/377,367

(22) PCT Filed: Jun. 18, 2009

(86) PCT No.: PCT/EP2009/057619
§ 371 (c)(1),
(2), (4) Date: Feb. 22, 2012

(87) PCT Pub. No.: WO2010/145704
PCT Pub. Date: Dec. 23, 2010

(65) Prior Publication Data
US 2012/0196137 A1    Aug. 2, 2012

(51) Int. Cl.
C23C 14/16    (2006.01)
C23C 14/06    (2006.01)
C23C 16/26    (2006.01)

(52) U.S. Cl.
CPC ............ C23C 16/26 (2013.01); C23C 14/0605 (2013.01)
USPC ............ 428/408; 51/307; 51/309; 204/192.1; 204/192.15; 204/192.16; 249/114.1; 416/241 R; 427/249.1; 427/249.5; 427/249.7; 427/249.15; 427/249.17; 427/249.16; 428/697; 428/698; 428/699; 428/704

(58) Field of Classification Search
CPC ............................ C23C 14/0605; C23C 16/26
USPC ............ 427/577, 249.1; 428/408, 697, 698, 428/699, 704; 204/192, 192.1; 416/241 R; 249/114.1; 51/307, 309
See application file for complete search history.

(56) References Cited

U.S. PATENT DOCUMENTS

| | | | |
|---|---|---|---|
| 4,525,417 A | 6/1985 | Dimigen et al. | |
| 5,249,554 A | * 10/1993 | Tamor et al. | 428/408 |

(Continued)

FOREIGN PATENT DOCUMENTS

| | | |
|---|---|---|
| DE | 3246361 | 9/1983 |
| DE | 258341 | 7/1988 |

(Continued)

OTHER PUBLICATIONS

PCT/EP2009/057619 International Search Report.

(Continued)

*Primary Examiner* — Archene A Turner
(74) *Attorney, Agent, or Firm* — Greenblum & Bernstein, P.L.C.

(57) ABSTRACT

The invention relates to a protective coating, having the chemical composition $C_a Si_b B_d N_e O_g H_l Me_m$, wherein Me is at least one metal of the group consisting of {Al, Ti, V, Cr, Zr, Nb, Mo, Hf, Ta, W, Y, Sc, La, Ce, Nd, Pm, Sm, Pr, Mg, Ni, Co, Fe, Mn}, with a+b+d+e+g+l+m=1. According to the invention, the following conditions are satisfied: $0.45 \leq a \leq 0.98$, $0.01 \leq b \leq 0.40$, $0.01 \leq d \leq 0.30$, $0 \leq e \leq 0.35$, $0 \leq g \leq 0.20$, $0 \leq l \leq 0.35$, $0 \leq m \leq 0.20$. The invention relates also to a coated member having a protective coating, as well as to a method for producing a protective coating, in particular a multilayer film for a member.

34 Claims, 7 Drawing Sheets

(56) References Cited

U.S. PATENT DOCUMENTS

| | | | |
|---|---|---|---|
| 5,474,816 A * | 12/1995 | Falabella | 427/577 |
| 5,653,812 A * | 8/1997 | Petrmichl et al. | 427/578 |
| 5,750,210 A * | 5/1998 | Schmidt et al. | 427/577 |
| 6,468,642 B1 * | 10/2002 | Bray et al. | 428/408 |
| 6,572,935 B1 | 6/2003 | He et al. | |
| 6,962,751 B2 | 11/2005 | Fukui et al. | |
| 7,381,452 B2 * | 6/2008 | Goncalves Neto et al. | 427/577 |
| 7,544,419 B2 * | 6/2009 | Lynch | 428/408 |
| 7,935,426 B2 * | 5/2011 | Vetter | 428/698 |
| 8,309,234 B2 * | 11/2012 | Vetter | 428/697 |
| 8,309,235 B2 * | 11/2012 | Vetter | 428/697 |
| 2003/0054171 A1 | 3/2003 | Fukui et al. | |
| 2006/0005900 A1 | 1/2006 | Dorfman | |
| 2010/0304102 A1 | 12/2010 | Vetter | |

FOREIGN PATENT DOCUMENTS

| | | |
|---|---|---|
| EP | 1266879 | 12/2002 |
| EP | 1574594 * | 9/2005 |
| EP | 1783245 | 5/2007 |
| EP | 1783349 | 5/2007 |
| JP | 6 072303 B | 9/1994 |
| JP | 2000-326108 * | 11/2000 |
| JP | 2004-034186 * | 2/2004 |
| JP | 2007 126714 A | 5/2007 |
| WO | 97/12075 | 4/1997 |
| WO | 00/56127 | 9/2000 |
| WO | 00/75394 * | 12/2000 |

OTHER PUBLICATIONS

Hegemann D et al., "PACVD-Derived thin Films in the System Si-B-C-N" Chemical Vapor Deposition, Wiley-Vch Verlag, Weinheim, DE LNKD-DOI:10.1002/(SICI)1521-3862(199903)5:2<61::AID-CVDE61>3.0.CO;2-Z, vol. 5, No. 2, Mar. 1, 1999, pp. 61-65.

Pujada B et al.: "Growth Stress in Tungston Carbide-Dimond-Like Carbon Coatings" Journal of Applied Physics, American Institute of Physics, New York, US LNKD-DOI:10.1063/1.3073890, vol. 105, No. 3, Feb. 2, 2009, pp. 33502-33502.

* cited by examiner

PROTECTIVE COATING, A COATED MEMBER HAVING A PROTECTIVE COATING AS WELL AS METHOD FOR PRODUCING A PROTECTIVE COATING

TECHNICAL FIELD

The present invention relates to a protective coating for a member excellent in sliding characteristics and improved heat resistance, which is produced by forming a hard film on a member required to have abrasion resistance and sufficient high-temperature oxidation resistance, to a coated member having a protective coating such as cutting tools, molds, forming tools, engine parts, gas turbines and the like, and also to a method for producing a protective coating, in particular a multilayer film for a member.

BACKGROUND ART

Slide members are often coated with nitride coatings like CrN or TiN, however more and more also diamond like carbon (DLC) are applied. It is considered useful for coating slide members, as readily providing a smooth surface and excellent in frictional characteristics. For example, Patent Reference 1 discloses a technique of forming a DLC film of the type a-C:H on a metal substrate. Patent Reference 2 describes a modification of a-C:H coatings by incorporation of different metals. The coatings are termed as a-C:H:Me coatings. Patent Reference 3 has realized improved the heat resistance and increased hardness of a DLC film by defining the content of the hydrogen content in the film at a low level ca. 5 at %. Patent Reference 4 and Patent Reference 5 disclose a DLC film containing Si in the carbon film.

Patent Reference 6 shows the modification of optical properties of a-C:H coatings by incorporation of silicon or boron.

However, since the coatings mentioned in Patent References 1 to 6 are based on carbon with some alloying elements like hydrogen and/or metal, or silicon or boron, the improvement in the heat resistance thereof is limited: to ca. 350-400° C. in the phase stability and to ca. 400-500° C. concerning the oxidation in air.

Contrary to this, the applicant of the present invention has proposed an Si (BCNO)-based film as in Patent Reference 7, for enhancing the heat resistance thereof and further increasing the hardness thereof. Accordingly, the abrasion resistance and the heat resistance of the film for use for cutting tools and abrasion-resistant members have been drastically enhanced. Over Patent Reference 7, the present invention is to enhance not only the abrasion resistance and the heat resistance but also the sliding characteristics of the film.

PRIOR ART REFERENCES

Patent References

| | |
|---|---|
| [Patent Reference 1] | DD 258341 |
| [Patent Reference 2] | DE 32 46 361 A1 |
| [Patent Reference 3] | EP-A-1 266 879 |
| [Patent Reference 4] | EP-A-1 783 349 |
| [Patent Reference 5] | WO 97/12075 |
| [Patent Reference 6] | WO 00/56127 |
| [Patent Reference 7] | EP-1 783 245 |

SUMMARY OF THE INVENTION

Problems to be Solved

For automotive applications the $CO_2$ emissions have to be reduced. One way to achieve this is to reduce the friction loss in the engine and transmission. This can be realized by coating parts like, tappets, injection system parts and piston rings or liners.

However traditional DLC coatings show some limitations in the heat resistance.

Another example for the requirement to improve the properties of classical DLC coatings is in the field of cutting technology. The recent tendency is directed toward short-time operation under high-efficiency working condition for shortening the production time. Accordingly, the cutting speed is accelerated and the feeding amount is increased for more advanced high-efficiency operation than conventionally. For example, cutting speed acceleration may increase the working heat and the tools may be more greatly damaged due to the heat. On the other hand, when the feeding amount is increased, the interfacial pressure between the tool and the subject being worked increases, therefore causing early-stage abrasion under the increased interfacial pressure. In addition to this, also the reduction of the amount of lubricant is one important goal in modern production. Thus the friction especially in the areas of chip transport has to be decreased.

Though there may be some differences in any case, the influence of working heat is being larger than under conventional working conditions, and it is indispensable to improve the heat resistance and the oxidation resistance of tools and the films to coat tool surfaces. In addition, also needed are physical properties of high hardness and high lubricity so as to inhibit the abrasion occurring under high interfacial pressure. Accordingly, an object of the invention is also to provide a multilayer film coated member, which is coated with a hard film having lubrication characteristics on a similar level as that of conventional DLC and having sufficient high hardness and sufficient high heat resistance, and to provide a method for producing it.

Means for Solving the Problems

The invention relates to a coated member, which is coated with a hard film comprising carbon, silicon and boron as the main ingredients.

Thus, a protective coating is provided, having the chemical composition $C_a Si_b B_d N_e O_g H_l Me_m$, wherein Me is at least one metal of the group consisting of {Al, Ti, V, Cr, Zr, Nb, Mo, Hf, Ta, W, Y, Sc, La, Ce, Nd, Pm, Sm, Pr, Mg, Ni, Co, Fe, Mn} with $a+b+d+e+g+l+m=1$. According to the invention, the following conditions are satisfied: $0.45 \leq a \leq 0.98$, $0.01 \leq b \leq 0.40$, $0.01 \leq d \leq 0.30$, $0 \leq e \leq 0.35$, $0 \leq g \leq 0.20$, $0 \leq l \leq 0.35$, $0 \leq m \leq 0.20$.

As clearly disclosed be the aforementioned formula, additional modifying elements such as nitrogen and oxygen may be contained in the film. As later disclosed in the present description of the invention, some metal elements might be also included, especially if they are necessary to produce sufficient high quality targets for the film deposition. Caused by the deposition method some hydrogen is mostly incorporated in the coatings. Other impurities from the manufacturing of the targets (e.g. In) might be incorporated too. If a sputtering process is used for the coating process also residue sputtering gas (e.g. Ar) might be included.

Since the film contains silicon and boron, it becomes more stable in heat resistance than carbon containing coatings having only silicon or only boron, or only metal respectively.

That is, its heat resistance is drastically enhanced and the film can exhibit sufficient heat resistance even under service environments that are more sever. In addition, since the film contains amorphous carbon suitably, its lubrication characteristics are excellent.

The existence of free amorphous carbon in the coating is important, that means the existence of carbon which is not chemically bonded to silicon or boron. The carbon atoms are bonded to each other forming an own phase in the film. To characterize this, Raman spectrometry has proven to be a suitable method. The peak detected between 1300 and 1600 $cm^{-1}$ in Raman spectrometry is one derived from amorphous carbon. A simple way to increase the carbon content in the coating is the sputtering of at least silicon and boron containing target. During film formation, a definite hydrocarbon-based gas can be used to adjust the C content of the formed film, in which, therefore, the C elements bond to each other, not bonding to any other element (excluding hydrogen) if a sufficient high carbon content is reached, in particular a certain amount of carbon is not bonded to silicon and boron thus forming C—C bonding. This is confirmed from the data in Raman spectrometry where C—C bond is detected.

If between the substrate and the hard film, the member has an additional hard film comprising at least two metal ingredients selected from Al, Ti, Cr, Nb, W, V, Zr, Hf, Ta, Mg, Mo Y, Sc, La, and lanthanides like Ce, Pr, Nd, Pm, Sm and at least one non-metallic ingredient selected from N, C, O; Si, B, and S, and the additional hard film forms a multilayer structure along with the above-mentioned hard film A. Accordingly, the adhesion of the hard film A to the substrate is enhanced, and the hard film A can fully exhibit its properties.

Furthermore the adhesion of the coatings can be tailored also by depositing a metallic interlayer (e.g. Cr or TiSi) at the substrate surface before the hard film A is deposited.

In the multilayer film coated member of the invention, as coated with hard films, the film has greatly enhanced lubricity and heat resistance. The invention provides not only the hard film A as the only one coating at the functional surface, also the multilayer film coated member coated with a hard film A, and a method for producing it.

Figure 1:
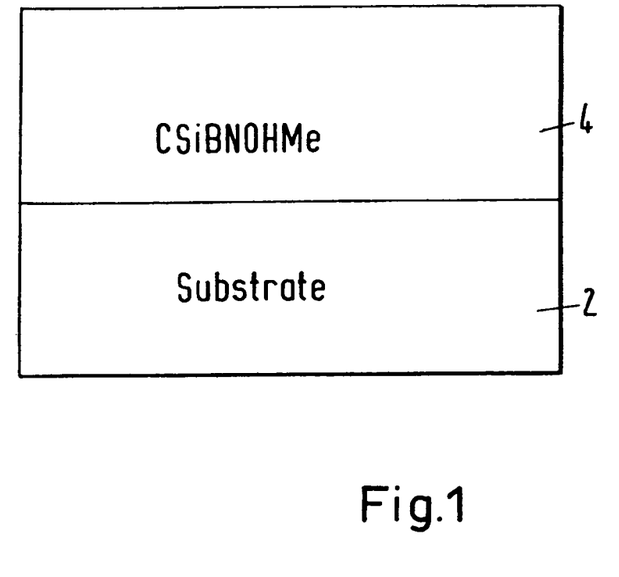
FIG. 1 shows a typical embodiment of the present invention having a single layer structure.
Figure 1A:
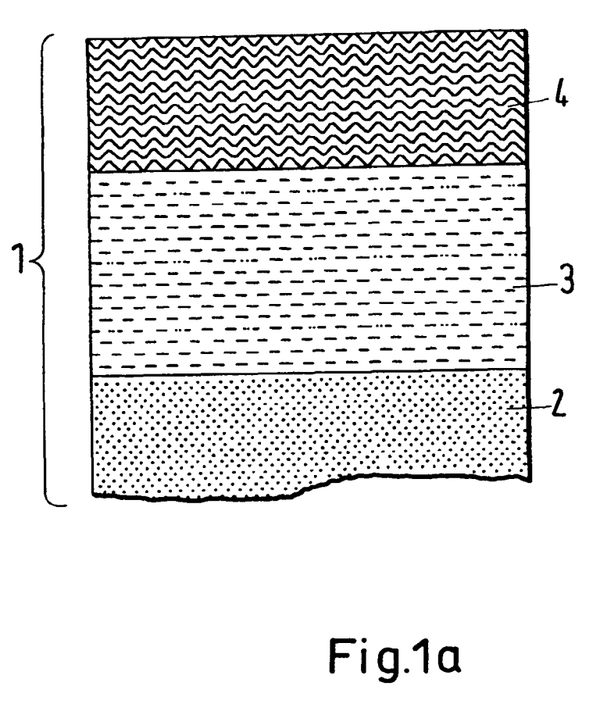
FIG. 1a shows a typical layer structure of a film-coated member of a two-layer structure.
Figure 2:
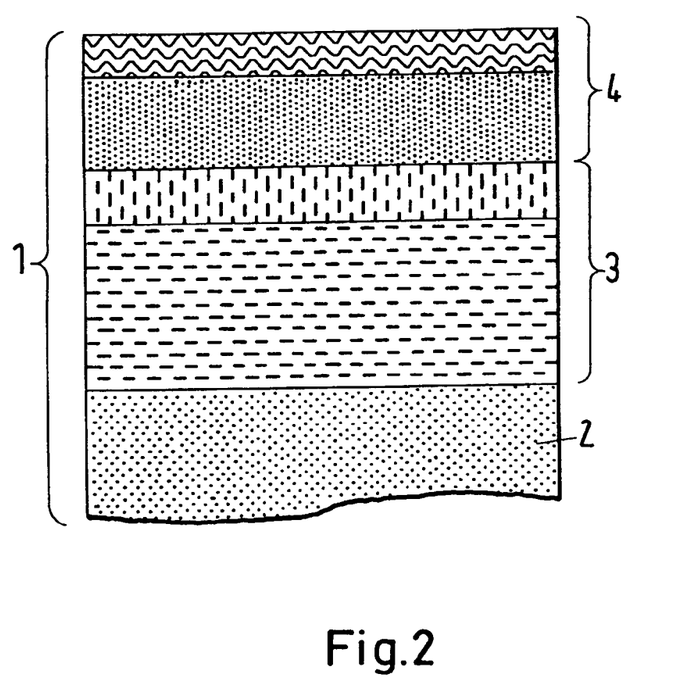
FIG. 2 shows a typical layer structure of a film-coated member of a multilayer structure.

Special embodiments of coatings according to the invention are shown in FIG. 1a and FIG. 2. In FIG. 1, the hard film A and the hard film B both are single layers, and the coated member has a two-layer structure. The hard film A is positioned on the outermost surface side of the member. In FIG. 2, the hard film A and the hard film B both have a multilayer structure. The hard film A is positioned on the outermost surface side of the member.

The method for producing a multilayer film coated member of the invention is a method suitable for coating members with the film having the above-mentioned characteristics.

FIG. 1 shows a typical embodiment of the present invention having a single layer structure, wherein the single layer is a CSiBNOHMe layer. In a special embodiment, a coating according to FIG. 1 may have a composition of $C_{0.65}Si_{0.20}B_{0.08}N_{0.05}O_{0.02}$. The 600 nm thick coating has for example a nanohardness of 2100+/−100. The coating were X-ray amorphous, e.g. no refractions peak from the coating material were detected. The stress measured by the bending method of the substrate (cemented carbide) was about 1.2 GPa.

In the following a more detailed discussion is made about the measurement to show the free carbon content. Regarding for example a Raman spectrum, Ix indicates the peak resulting from amorphous carbon. It is known that the peak intensity varies depending on the film thickness, and therefore, it is impossible to define the existing absolute amount of amorphous carbon in the film from the peak intensity. Regarding films having the same amount of amorphous carbon existing therein but having a different thickness, a thicker film tends to give a higher peak intensity. Accordingly, a method to try to eliminate the thickness dependence of the peak intensity must be used. For this, the maximum intensity Iy in the background in the spectrometry is used, and the existing amount of amorphous carbon is defined relatively to the intensity ratio of the peak intensity of amorphous carbon at Ix to the maximum intensity Iy in the background. Iy is the maximum intensity in the background, and like Ix, its intensity varies depending on the film thickness. A thicker film gives higher Ix and Iy, and it is considered that the ratio Ix/Iy defines the existing amount of amorphous carbon relatively to it.

Figure 6:
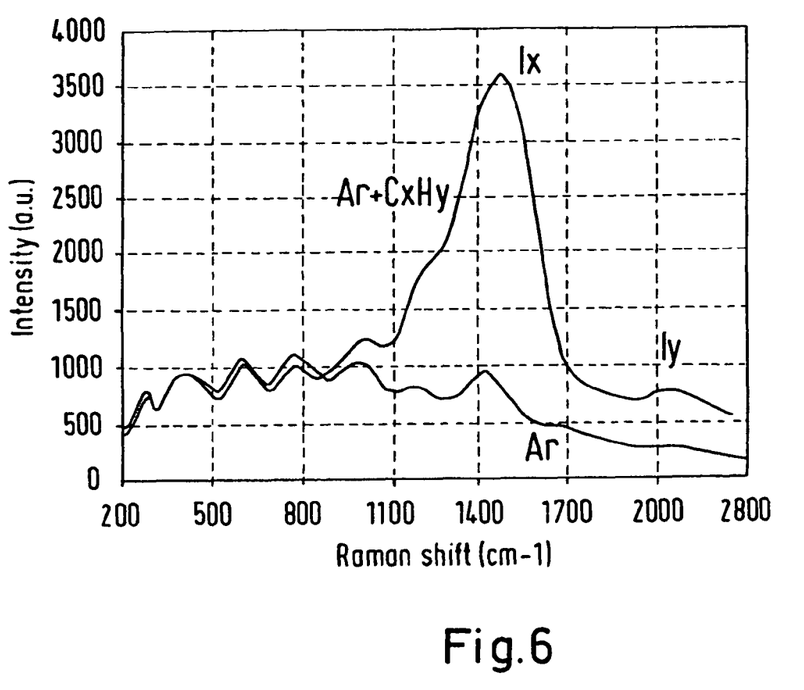
FIG. 6 shows the data of Raman spectrometry in Example 1 of the invention.

Within the limitation of the described method the following findings were made. Al least, satisfying $3.2 \leq Ix/Iy$, the film has the effect of lubricity characteristics. When $Ix/Iy<3.2$, then the relative existing amount of amorphous carbon in the film is small, and therefore the film could not has a lower lubricating effect. When $Ix/Iy>8.0$, then the relative existing amount of amorphous carbon in the film is large, and therefore the heat resistance of the film is lower with the result that the film use is more limited, however the lubrication properties and the heat resistance are improved against conventional DLC films. Since for the deposition of the examples a hydrocarbon-based gas is used in film formation, it has been confirmed that the C—H bond is also detected in the film. FIG. 6 shows an example of the data of Raman spectrometry.

For the Raman spectrometry, used was a microlaser Raman spectrometer by Seki Technotron. The assay condition is as follows:

(Assay Condition)

Solid laser wavelength for excitation: 532 nm.
Detector: cooled CCD multichannel.
Spectrometer: Chromex's 250-is Imaging Spectrograph.
Run time: 60 seconds.
Sample condition: room temperature, in air.

In the embodiment of the hard film A containing oxygen, the oxygen concentration in the film is preferably so controlled as to be the highest in the region near to the surface layer falling from the outermost surface layer to the range of at most 500 nm in the film thickness direction, from the viewpoint of the lubricity and the oxidation resistance of the film under abrasive environments. Preferably, oxygen exists in the film as oxides with silicon or boron. In case where oxygen exists in the film as its solid solution, then it may form silicon oxide and boron oxide, for example, during operation resulting in higher temperatures in the contact zone of the wear couple. In such a case, the ingredients constituting the member of the friction counter part may diffuse inside the film, thereby often causing melt fusion and worsening the mechanical properties of the film. Therefore, it is desirable that oxygen exists in the film in the form of oxides therein.

If the sputtering is done from a silicon and boron containing target (e.g. SiC/BN mixtures), than for controlling the ratio of Ix/Iy, the ratio of the flow rate, Fy, of the reaction gas, hydrocarbon-based gas (e.g. $C_2H_2$), to the flow rate, Fx, of the process gas argon in film formation, Fy/Fx is controlled for example to $0.007 \leq Fy/Fx \leq 0.50$. Preferably, the film formation pressure in the stage is controlled to be within a range of approximately from 0.01 Pa to 3.0 Pa. When Fy/Fx<0.007, then the flow rate of the hydrocarbon-based gas is low, therefore resulting in IX/Iy<3.2. As a result, the existing amount of amorphous carbon in the film reduces and the film could not have sufficient lubricity characteristics. On the other hand, when Fy/Fx>0.50, then Ix/Iy>8.0 with the result that the use of the film is more limited to lower temperature use, however showing still improved heat resistance. Accordingly, the ratio Fy/Fx is preferentially controlled to $0.007 \leq Fy/Fx \leq 0.50$.

As the hydrocarbon-based gas, herein usable is methane acetylene, benzene, or methylbenzene or, and acetylene is preferred.

The main role of the hard film B in the invention of the two-layer structure, is to combine the properties of the hard film A with the properties of the hard film B. The hard film A and the hard film B each may have a multilayer structure showing in FIG. 2. For example, the hard film A is CSiB, and it may have a multilayer structure in which the C content is increased in the area near the surface layer thereof. The hard film B may have a multilayer too, e.g. structure of (TiAl)N/(TiSi)N. In this structure, (TiSi)N is applied between the hard film. A and (AlTi)N, thereby increasing the abrasion resistance and the adhesiveness of the multilayer film. As the case may be, the proportion of the hard film A to the entire multilayer film could not be increased since the hard film A may increase the residual compression stress of the multilayer film; and in such a case, the hard film B is thickened. Regarding the ratio of the hard film A to the hard film B, the proportion of the hard film A is preferably from 2% to 50% relative to the entire multilayer film taken as 100%. In order to make the hard film A to exhibit sufficiently its characteristics, the hard film B must have excellent adhesion strength to the surface of the substrate.

In the invention, the hard film A may be formed according to a sputtering method using RF. In this case, preferably used is a composite target of silicon carbide and boron nitride; however, silicon carbide and boron nitride may be disposed in different coating sources, and the two may be sputtered at the same time to form the hard film A.

Other, not only limited to the following PVD-method, magnetron sputtering methods are usable. e.g. at DC sputtering or pulsed sputtering including High Power Pulsed Magnetron Sputtering from composite targets like carbon targets with inserts made of SiC, $B_4C$ and the reactive gases containing nitrogen.

Also arc evaporation methods are possible by alloying carbon cathodes with Si and boron and/or the use of appropriate reactive gases containing boron or silicon to deposit a coating according to the invention.

Another simple method to deposit such coatings are pure CVD and PE-CVD methods by using appropriate precursors containing at least carbon, silicon and boron.

In one preferred method of forming the multilayer film, the hard film A is formed according to a sputtering method and the hard film B is formed according to an arc ion plating method (AIP method) and/or a sputtering method. For example, in FIG. 1a, it is important that the film 3 of the hard film B has an enhanced adhesion strength to the substrate 2, and therefore, an AIP method is preferred for the interfacial area between the substrate 2 and the film 3. The other area than the interfacial area may be formed according to a sputtering method for further enhancing the abrasion resistance of the formed film. The method may be combined with an AIP method. The hard film A of the film 4 is coated according to a sputtering method. Regarding the coating sources and the bias power in the sputtering method and the bias power in the AIP method in the coating film formation, a high-frequency power or a direct current power may be applied, but from the viewpoint of the stability in the coating process, a high-frequency power is used for the sputtering power. As the bias power, more preferred is a high-frequency bias power in consideration of the electroconductivity of the hard film and of the mechanical properties of the hard film.

Figure 3:
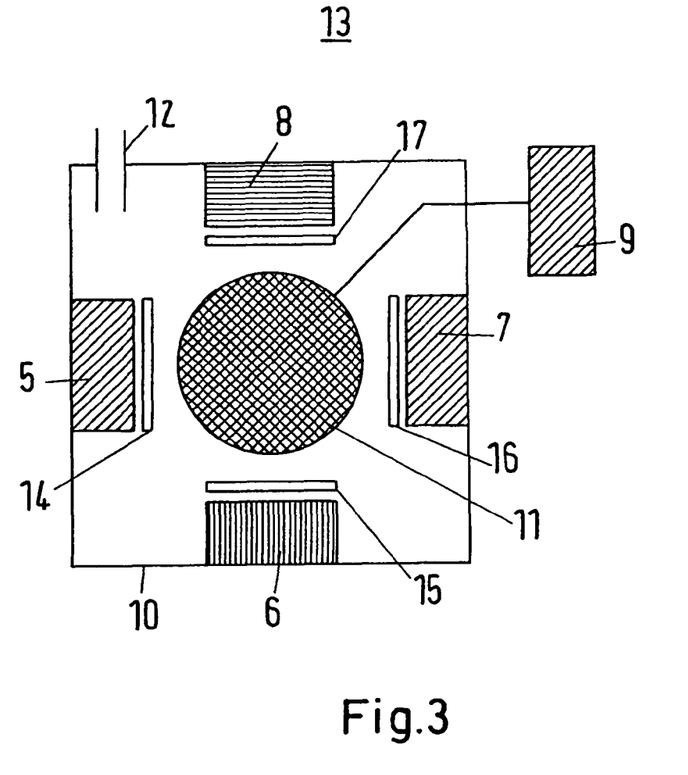
FIG. 3 shows one example of an apparatus used in film formation for a film coated member of the invention.

FIG. 3 is a graphic view showing the structure of a coating apparatus 13 for coating the substrate of the invention. The coating apparatus 13 comprises a vacuum chamber 10; four coating sources 5, 6, 7 and 8; and their shutters 14, 15, 16 and 17. In this, 5 and 7 each are an RF coating source; and 6 and 8 each are an arc source. Each coating source has its shutter, which individually shuts the coating source. The shutters are driven independently of each other, therefore capable of individually shutting the respective coating sources. Accordingly, during the coating process, it is unnecessary to temporarily stop the coating source. A process gas of argon and a reaction gas of $N_2$, $O_2$ or $C_2H_2$ are fed into the vacuum chamber 10, which therefore has a vapor inlet port 12 provided with a switching mechanism. The substrate holder 11 provided with a rotating mechanism is connected with a direct current (DC) bias power or high-frequency (RF) bias power 9. Regarding the coating method with the films, one preferred embodiment of the moving mechanism of the coating apparatus 13 and the coating process is described below.

(1) Cleaning:

After held by the substrate holder 11, the substrate 2 is heated at 250° C. to 800° C. During this, all the source shutters are kept shut. The substrate is cleaned with ions by applying a pulse bias voltage thereto from the bias power 9.

(2) Coating with hard film B:

After the substrate is thus cleaned, the shutters 15 and 17 for the arc sources 6 and 8 are opened, and the substrate is coated with a hard film B. The hard film B may be formed according to a DC sputtering method or a DC-AIP method. The DC bias voltage to be given for film formation is preferably from about 10 V to 400 V. As the case may be, a bipolar pulse bias voltage may also be employed. The frequency in this stage is preferably within a range of from 0.1 kHz to 300 kHz, and the positive bias voltage is preferably within a range of from 3 V to 100 V. The pulse/pause ratio may be within a range of from 0.1 to 0.95. During the formation of the hard film B, the RF coating sources 5 and 7 are driven while the shutters 14 and 16 are kept shut. This is for the purpose of removing the impurities such as oxides from the target surface. After the formation of the hard film B, the shutters 14 and 16 are opened, and the RF coating sources 5 and 7 are simultaneously driven to start the next film formation.

(3) Coating with hard film A:

The hard film A, consisting at least of CSiB, is formed from the RF magnetron sources 5 and 7. Specifically, the RF magnetron sources 5 and 7 are preferably a composite target material of silicon carbide and silicon nitride. The surface side of the hard film A may contain a larger amount of carbon by supplying the process gas of acetylene or the like to the vacuum chamber 10 via the vapor inlet port 12. Preferably, the carbon content in the hard film A is higher in the area nearer to the surface side, as contributing toward enhancing the sliding characteristics of the film.

The coatings show typical harnesses of 1500 to 3500 and intrinsic macroscopic stresses measured by bending test on cemented carbide of: −0.5 to −3.5 GPa (coating thickness of ca. 1.5 um).

All coatings are X-ray amorphous.

If a single layer film A will be directly coated at the substrates then a similar coating procedure excluding the deposition of film B is made. Another example is to deposit instead the nitride coatings metallic interlayers before the film A is deposited.

Also multilayers with more than two layers can be deposited by intermediate depositing of the film B and film B. If the sources for traditional hard coatings like AlTiN, e.g. AIP and the Sources for the film A, e.g. sputtering sources are running at the time, than nanomultilayers are generated by moving the substrates from source type for the film B to the source type of film A.

The invention is described with reference to Examples hereinunder.

Example 1

For evaluating the physical properties of the hard film A of the invention, a substrate was coated with a hard film using hard metal containing Co content 3% by weight or more and less than 12% by weight according to the coating method mentioned below. In most cases for the investigation a film B were first deposited. This was done, to show direct the influence of such a film A to protect at a substrate (here than the hard film B).

The coating method comprises a first step of heating a tool at 500° C.; a second step of ion-cleaning the tool for about 30 minutes by applying thereto a pulse bias voltage having a negative voltage of 200 V, a positive voltage of 30 V, a frequency of 20 kHz and a pulse/pose ratio of 4; a third step of coating the tool with (AlTi)N from an arc source; a fourth step of cleaning the target surface by discharging the sputtering target while the shutters are closed and while the tool is kept coated with (AlTi)N from the arc source; a fifth step of coating of the hard film A by RF sputtering coating from an RF magnetron source, using a target of BN/SiC in a mixed ratio by mol of 1/3; and a sixth step of coating of the hard film A in RF+DC by applying a DC bias having a negative voltage of 50 V to the sample in addition to the RF bias thereto. According to the process of the above first to sixth steps, the tool was coated. In the sixth step, acetylene as the reaction gas was introduced into the chamber along with the process gas Ar thereinto, as a mixed gas of Ar+$C_2H_2$, and the ratio was controlled to be Fy/Fx=0.05. Finally, the laminate structure was comprised of (AlTi) N and of the hard film A as laminated in that order, and the film thickness was about 3 μm. The sample coated according to the first coating method is Example 1 of the invention. The composition of the hard film 2 in Example 1 was changed variously, thereby producing samples of Example 2 to Example 36 of the invention. The ratio (Fy/Fx) of the mixed gas of Ar+$C_2H_2$ to be introduced into the chamber was changed variously, thereby producing samples of Example 2 to Example 7 and 35 to 36 of the invention.

The details of those Examples are shown in Table 1.

TABLE 1

Special embodiments according to the invention as well examples known from the state of the art.

| | Sample No. | Hard film B | Hard film A | Fy/Fx | Ix/Iy |
|---|---|---|---|---|---|
| Invention | 1 | (Al0.6Ti0.4)N | Si(0.21)B(0.07)N(0.06)C(0.60)O(0.06) | 0.05 | 3.87 |
| | 2 | (Al0.6Cr0.4)N | Si(0.16)B(0.05)N(0.04)C(0.71)O(0.04) | 0.10 | 4.28 |
| | 3 | (Al0.6Cr0.4)N | Si(0.16)B(0.04)N(0.04)C(0.73)O(0.03) | 0.15 | 4.87 |
| | 4 | (Al0.6Cr0.4)N | Si(0.15)B(0.03)N(0.04)C(0.76)O(0.02) | 0.20 | 5.43 |
| | 5 | (Al0.6Cr0.4)N | Si(0.14)B(0.02)N(0.04)C(0.78)O(0.02) | 0.30 | 6.02 |
| | 6 | (Al0.6Cr0.4)N | Si(0.13)B(0.02)N(0.04)C(0.79)O(0.02) | 0.40 | 6.85 |
| | 7 | (Al0.6Cr0.4)N | Si(0.12)B(0.02)N(0.04)C(0.81)O(0.01) | 0.45 | 6.88 |
| | 8 | (Al0.6Ti0.4)N/(Ti0.8Si0.2)N | Si(0.20)B(0.08)N(0.06)C(0.62)O(0.04) | 0.05 | 3.57 |
| | 9 | (Al0.6Ti0.4)N/(Cr0.9Si0.1)NB | Si(0.22)B(0.08)N(0.07)C(0.59)O(0.04) | 0.05 | 3.92 |
| | 10 | (Al0.5Ti0.4Cr0.1)N | Si(0.21)B(0.08)N(0.05)C(0.61)O(0.05) | 0.05 | 4.24 |
| | 11 | (Al0.5Ti0.4Nb0.1)N | Si(0.19)B(0.08)N(0.06)C(0.60)O(0.06) | 0.05 | 3.43 |
| | 12 | (Al0.5Ti0.4Si0.1)N | Si(0.17)B(0.06)N(0.08)C(0.64)O(0.05) | 0.05 | 3.99 |
| | 13 | (Al0.5Ti0.4W0.1)N | Si(0.20)B(0.08)N(0.06)C(0.62)O(0.04) | 0.05 | 4.43 |
| | 14 | (Al0.5Ti0.4W0.1)(SN) | Si(0.24)B(0.07)N(0.05)C(0.58)O(0.06) | 0.05 | 3.92 |
| | 15 | (Al0.7Cr0.3)N | Si(0.25)B(0.06)N(0.05)C(0.61)O(0.03) | 0.05 | 3.74 |
| | 16 | (Al0.6Cr0.3Si0.1)N | Si(0.19)B(0.09)N(0.06)C(0.62)O(0.04) | 0.05 | 3.33 |
| | 17 | (Al0.6Ti0.4)N | Si(0.20)B(0.09)N(0.05)C(0.62)O(0.04) | 0.05 | 3.29 |
| | 18 | (Al0.6Ti0.4)N | Si(0.18)B(0.08)N(0.07)C(0.62)O(0.05) | 0.05 | 4.03 |
| | 19 | (Al0.6Ti0.4)N | Si(0.24)B(0.05)N(0.03)C(0.65)O(0.03) | 0.05 | 3.67 |
| | 20 | (Al0.6Ti0.4)N | Si(0.26)B(0.06)N(0.05)C(0.59)O(0.04) | 0.05 | 3.88 |
| | 21 | (Al0.5Ti0.5)ON | Si(0.22)B(0.06)N(0.06)C(0.62)O(0.04) | 0.05 | 3.44 |
| | 22 | (Ti0.9Nb0.1)CN | Si(0.16)B(0.05)N(0.08)C(0.66)O(0.05) | 0.05 | 4.56 |
| | 23 | (Ti0.8Si0.2)N | Si(0.24)B(0.06)N(0.05)C(0.59)O(0.06) | 0.05 | 4.63 |
| | 24 | (Ti0.9W0.1)N | Si(0.21)B(0.07)N(0.05)C(0.63)O(0.04) | 0.05 | 3.75 |
| | 25 | (Cr0.3Al0.6W0.1)N | Si(0.22)B(0.09)N(0.07)C(0.59)O(0.03) | 0.05 | 3.49 |
| | 26 | (Cr0.9Si0.1)BO | Si(0.23)B(0.09)N(0.08)C(0.56)O(0.04) | 0.05 | 3.39 |
| | 27 | (Cr0.9Nb0.1)N | Si(0.22)B(0.07)N(0.06)C(0.61)O(0.04) | 0.05 | 4.27 |
| | 28 | (Cr0.9W0.1)CN | Si(0.25)B(0.05)N(0.04)C(0.62)O(0.04) | 0.05 | 3.77 |
| | 29 | (W0.4Si0.6)C | Si(0.26)B(0.05)N(0.04)C(0.60)O(0.05) | 0.05 | 3.79 |
| | 30 | (Nb0.4Si0.6)C | Si(0.17)B(0.06)N(0.07)C(0.66)O(0.04) | 0.05 | 3.50 |
| | 31 | (Ti0.9V0.1)N | Si(0.20)B(0.07)N(0.05)C(0.64)O(0.04) | 0.05 | 4.22 |
| | 32 | (Ti0.4Al0.5Mo0.1)N | Si(0.25)B(0.05)N(0.05)C(0.62)O(0.03) | 0.05 | 3.88 |

TABLE 1-continued

Special embodiments according to the invention as well examples known from the state of the art.

| Sample No. | Hard film B | Hard film A | Fy/Fx | Ix/Iy |
|---|---|---|---|---|
| 33 | (Ti0.9Zr0.1)N | Si(0.19)B(0.06)N(0.06)C(0.65)O(0.04) | 0.05 | 4.09 |
| 34 | (Ti0.4Al0.5V0.1)N | Si(0.18)B(0.08)N(0.06)C(0.63)O(0.05) | 0.05 | 4.11 |
| 35 | (Al0.6Ti0.4)N | Si(0.04)B(0.03)N(0.05)C(0.87)O(0.01) | 0.55 | 8.18 |
| 36 | (Al0.6Ti0.4)N | Si(0.03)B(0.03)N(0.03)C(0.90)O(0.01) | 1.00 | 8.76 |
| Comparison | | | | |
| 37 | (Al0.5Ti0.5)N/TiSiN | — | — | — |
| 38 | (Al0.5Ti0.5)N/TiBN | — | — | — |
| 39 | (Al0.6Ti0.4)N | Si(0.25)B(0.25)N(0.2)C(0.25)O(0.05) | — | 2.98 |
| 40 | (Al0.6Ti0.4)N | Si(0.15)B(0.35)N(0.3)C(0.15)O(0.05) | — | 2.11 |
| 41 | (Al0.6Cr0.3Si0.1)N | Si(0.43)B(0.10)N(0.11)C(0.25)O(0.11) | — | 3.12 |
| 42 | — | DLC | — | — |
| 43 | — | DLC(H2 free) | — | — |

By Table 2, the respective friction coefficients and oxidation thickness of the examples given in Table 1 are shown.

TABLE 2

Friction coefficients and oxidation thickness of the examples given in Table 1. Coating thickness of the invented film A ca. (600 +/− 100) nm.

| Sample No. | Friction coefficient | | | Oxidation thickness (nm) |
|---|---|---|---|---|
| | Room temp. | 300 deg. | 500 deg. | |
| Invention | | | | |
| 1 | 0.25 | 0.25 | 0.24 | 98 |
| 2 | 0.22 | 0.19 | 0.24 | 154 |
| 3 | 0.23 | 0.18 | 0.24 | 158 |
| 4 | 0.24 | 0.27 | 0.22 | 156 |
| 5 | 0.22 | 0.21 | 0.23 | 172 |
| 6 | 0.23 | 0.24 | 0.19 | 166 |
| 7 | 0.27 | 0.28 | 0.28 | 185 |
| 8 | 0.23 | 0.28 | 0.27 | 102 |
| 9 | 0.28 | 0.19 | 0.21 | 100 |
| 10 | 0.21 | 0.21 | 0.26 | 130 |
| 11 | 0.17 | 0.23 | 0.27 | 99 |
| 12 | 0.26 | 0.27 | 0.26 | 142 |
| 13 | 0.27 | 0.27 | 0.22 | 128 |
| 14 | 0.19 | 0.29 | 0.23 | 78 |
| 15 | 0.23 | 0.27 | 0.25 | 89 |
| 16 | 0.24 | 0.20 | 0.27 | 134 |
| 17 | 0.28 | 0.23 | 0.20 | 154 |
| 18 | 0.19 | 0.24 | 0.26 | 121 |
| 19 | 0.27 | 0.21 | 0.25 | 118 |
| 20 | 0.26 | 0.28 | 0.24 | 102 |
| 21 | 0.26 | 0.26 | 0.25 | 87 |
| 22 | 0.27 | 0.25 | 0.25 | 126 |
| 23 | 0.28 | 0.26 | 0.27 | 122 |
| 24 | 0.26 | 0.27 | 0.23 | 106 |
| 25 | 0.27 | 0.26 | 0.26 | 138 |
| 26 | 0.26 | 0.27 | 0.27 | 107 |
| 27 | 0.25 | 0.27 | 0.26 | 98 |
| 28 | 0.24 | 0.28 | 0.23 | 80 |
| 29 | 0.24 | 0.25 | 0.24 | 108 |
| 30 | 0.25 | 0.27 | 0.27 | 146 |
| 31 | 0.26 | 0.25 | 0.24 | 135 |
| 32 | 0.27 | 0.24 | 0.28 | 129 |
| 33 | 0.28 | 0.23 | 0.27 | 119 |
| 34 | 0.21 | 0.22 | 0.23 | 137 |
| 35 | 0.27 | 0.25 | 0.35 | 488 |
| 36 | 0.26 | 0.24 | 0.41 | 527 |
| Comparision | | | | |
| 37 | 0.78 | 0.68 | 0.62 | 874 |
| 38 | 0.71 | 0.57 | 0.28 | 1868 |
| 39 | 0.28 | 0.43 | 0.55 | — |
| 40 | 0.33 | 0.43 | 0.51 | — |
| 41 | 0.47 | 0.39 | 0.35 | — |
| 42 | 0.03 | 0.03 | 0.54 | — |
| 43 | 0.02 | 0.04 | 0.36 | — |

In addition to the special embodiments according of the invention according to table 1, also single-coating properties of a variety of coated films in accordance with the present invention have been investigated which results are shown in Table 3 by embodiments I to V.

TABLE 3

Additional embodiments according to the invention.

| No. | Chemical Composition | Friction Coefficient Room Temperature | Friction Coefficient 300° C. | Friction Coefficient 500° C. | Oxidation Thickness |
|---|---|---|---|---|---|
| I | $Si_{0.15}B_{0.05}N_{0.05}C_{0.6}H_{0.1}O_{0.05}$ | 0.18 | 0.20 | 0.24 | 148 |
| II | $Si_{0.25}B_{0.05}N_{0.1}C_{0.55}H_{0.03}O_{0.02}$ | 0.22 | 0.24 | 0.26 | 103 |
| III | $Si_{0.2}B_{0.1}N_{0.1}C_{0.55}H_{0.02}O_{0.02}Ti_{0.01}$ | 0.20 | 0.19 | 0.20 | 160 |
| IV | $Si_{0.16}B_{0.05}N_{0.1}C_{0.55}H_{0.02}O_{0.02}Ti_{0.1}$ | 0.25 | 0.27 | 0.22 | 181 |
| V | $Si_{0.2}B_{0.05}N_{0.1}C_{0.55}H_{0.02}O_{0.02}Ti_{0.06}$ | 0.19 | 0.22 | 0.23 | 150 |

In Example 1 to Example 7 of the invention of the hard film A, Fy/Fx was controlled thus changing the content in the amorphous carbon and as a result IX/Iy was thereby changed. On the other hand, in Example 35 and Example 36, Fy/Fx was selected to get a high carbon content, resulting in a high Ix/Iy. In comparison Example 39 to Example 41, a hydrocarbon-based gas was not used in the film formation. The low carbon content results directly from sputtering of the mixed target (SiC/BN).

For evaluating the sliding characteristics of the film A of the invention, the coated members in Examples of the invention and comparison Examples were tested for the friction coefficient by using a ball-on-disc type frictional test. Regarding the value of the friction coefficient, the data from the start of sliding to the end thereof were averaged to be the frictional coefficient of the tested sample.

In the test, used were a φ6-ball material of SUJ2, and a disc prepared by coating a cemented carbide insert of ISO Model No. SNMN120408 corresponding to K10, with a film A of the invention mostly deposited at a film B. Notice that the friction behavior is determined by the film A because the film A where never time fully worn during the friction test.

(Test Condition)
Sliding speed: 100 mm/sec.
Sliding radius: 3.0 mm
Load: 2 N.
Sliding distance: 50 m
Test temperature: room temperature, 300° C., 500° C.
Test atmosphere: in air, no lubrication.

The test results of the samples are shown in Table 2.

The found data of the friction coefficient in Table 2 and Table 3 confirm that the film A and caused by that also the multilayer film coated member samples of the invention all had a friction coefficient of μ<0.3 at room temperature, at 300° C. and at 500° C., therefore having excellent frictional characteristics. This is owing to the effect of the lubricity characteristics of the hard film A in those samples. From the results, it is understood that the film coated member of the invention has a friction coefficient μ≤0.3 within a temperature range of from room temperature to 500° C. On the other hand, in comparison Examples, the friction coefficient of all the samples could not be μ≤0.3. For example, in comparison Example 38, the friction coefficient in a high-temperature range was μ<0.3, but the friction coefficient at room temperature was μ=0.7 and was high. This is because in a high-temperature environment, the added element boron exhibited its lubricating effect, but in a room temperature range, the element did not exhibit the effect. In comparison Examples 42 and 43, the friction coefficient was μ<0.1 and was extremely low at around room temperature, but in a high-temperature range, the friction coefficient was unstable to the graphitization and oxidation of the film. Due to the high fluctuations at the higher temperatures (500° C.) it was difficult to give definite friction values.

The samples 35 and 36 with the highest carbon showed a similar friction values like the standard DLC-coatings at 500° C.

However the coating show some advantages still over the standard DLC coatings as shown later.

The samples of Examples of the invention and Comparative Examples were heat-treated and tested for their oxidation resistance. As the substrate in the test, used was an insert of an ultra-fine particulate cemented carbide alloy having a Co content of 8% by weight. In air under the condition of 1000° C. and 58% humidity, the samples were kept for 2 hours, and then cooled with cold air flow. After the heat treatment, the cross section of the hard film was analyzed with a scanning electronic microscope (hereinafter referred to as SEM), thereby measuring the thickness of the oxide layer. The oxide layer thicknesses are shown in Table 2 and Table 3. It should be mentioned that the comparison Examples 42 and 43, as hard carbon coating without boron and silicon where not able to withstand the high oxidation temperature. The examples 35 and 36 with the high carbon content showed still a good stability against oxidation.

Figure 4:
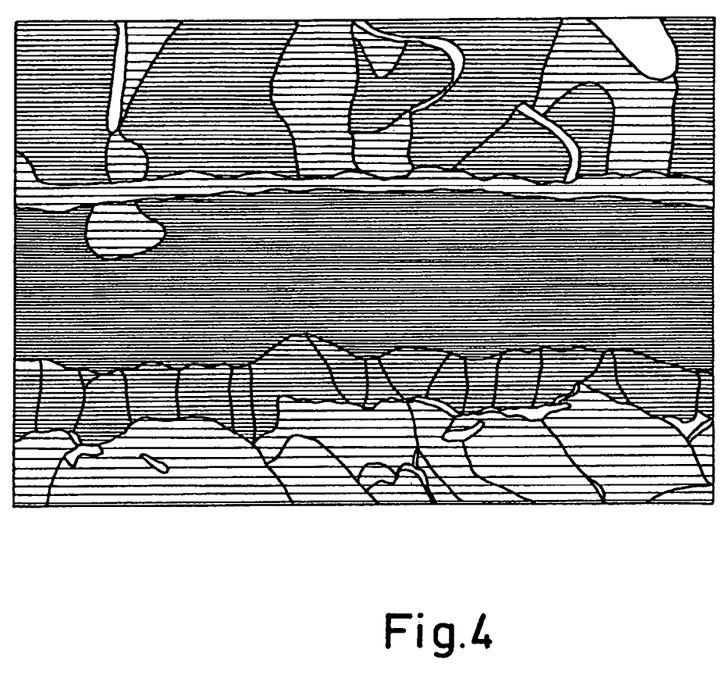
FIG. 4 is a scanning electromicroscopic picture of a cross section of a coated member after heat treatment in Example 1 of the invention.
Figure 5:
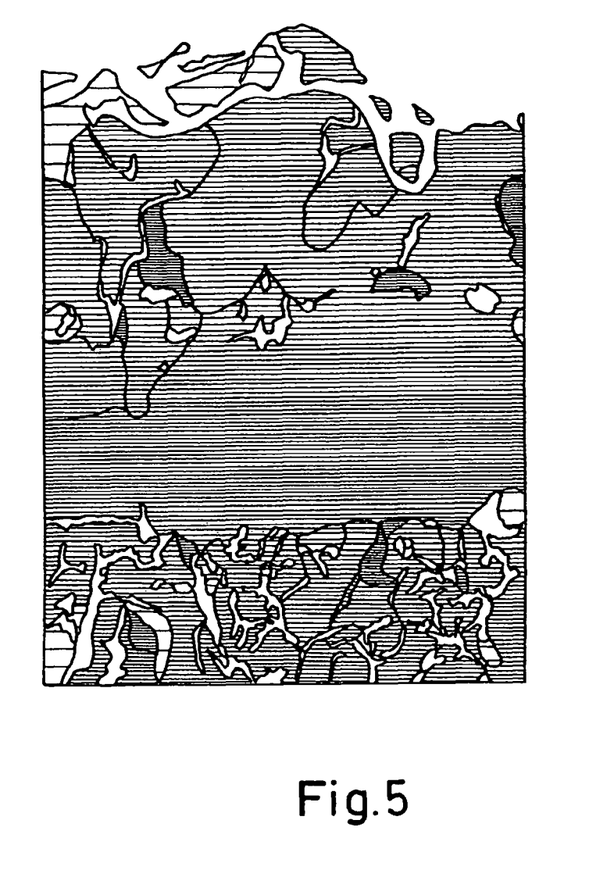
FIG. 5 is a scanning electromicroscopic picture of a cross section of a coated member after heat treatment of a conventional Example 38 known from the state of the art.

To Demonstrate the Excellent Heat-Resistance of the Film a SEM (Scanning Electron Microscope) Images are Shown FIG. 4 and FIG. 5 SEM (scanning electron microscope) images of the samples after heat treatment. FIG. 4 is a SEM picture of the sample of Example 1 of the invention; and FIG. 5 is a SEM picture of the sample of a comparison Example 38. The sample of comparison Example 38 as a hard coating with a TiSiN coating on top has within the group of traditional hard coatings an excellent oxidation resistance in high-temperature environments. Both in FIG. 4 and FIG. 5, only the film was oxidized, and the substrate was not oxidized. In the sample of Example 1 of the invention in FIG. 4, only the surface layer of the film A was oxidized, and the thickness of the oxide layer was 100 nm, or that is, the oxide layer was extremely thin. On the other hand, in the sample of comparison Example 38 of the invention in FIG. 5, the thickness of the oxide layer was 900 nm.

The results confirm that that the film of the invention has excellent oxidation resistance in high-temperature environments.

INDUSTRIAL APPLICABILITY

In general the inventions offers a solution within hard protecting coating excellent in oxidation resistance and lubricity characteristics, and is therefore applicable to members that require good abrasion resistance and good high-temperature oxidation resistance such as cutting tools, molds, forming tools, engine parts, gas turbines and the like, and also to members that require good sliding characteristics such as automobile engine parts and the like.

Beside the single layer film consisting at least of the elements CSiB, and the two layer multilayer films consisting of a traditional hard coating plus the film consisting at least of the elements CSiB also multilayer with more than one single layer of each type might be deposited. The thicknesses of each single layer might be in the nanometer range both of the film consisting at least of the elements CSiB and traditional hard coatings (e.g. AlTiN or AlCrMgSiN).

DESCRIPTION OF REFERENCE NUMERALS

1 Multilayer film coated member
2 Substrate
3 Hard film B
4 Hard film A
5 RF coating source
6 Arc source
7 RF coating source
8 Arc source
9 DC bias power or high-frequency (RF) bias power
10 Vacuum chamber
11 Substrate holder
12 Vapor inlet port or vapor discharge port
13 Coating apparatus
14 Shutter
15 Shutter
16 Shutter
17 Shutter

The invention claimed is:

1. A protective coating, having the chemical composition $C_aSi_bB_dN_eO_gH_lMe_m$, wherein Me is at least one metal of the group consisting of {Al, Ti, V, Cr, Zr, Nb, Mo, Hf, Ta, W, Y, Sc, La, Ce, Nd, Pm, Sm, Pr, Mg, Co, Ni, Fe, Mn}, with $a+b+d+e+g+l+m=1$,
and
$0.45 \leq a \leq 0.98$
$0.01 \leq b \leq 0.40$
$0.02 \leq d \leq 0.10$
$0 \leq e \leq 0.35$
$0 \leq g \leq 0.20$
$1 \leq l \leq 0.35$
$0 \leq m \leq 0.20$, and
wherein the coating contains amorphous carbon which is not chemically bonded to Si or B at a content that satisfies $3.2 \leq Ix/Iy \leq 8.0$, wherein Ix represents the peak of intensity of amorphous carbon in Raman spectrum, and Iy represents the maximum intensity in the background in Raman spectrum.

2. A protective coating in accordance with claim 1, wherein, apart from impurities, $e=0$ and $g=0$ and $l=0$ and $m=0$.

3. A protective coating in accordance with claim 1, wherein $0.56 \leq a \leq 0.81$.

4. A protective coating in accordance with claim 1, wherein $0.12 \leq b \leq 0.26$.

5. A protective coating in accordance with claim 1, wherein $0.03 \leq e \leq 0.08$.

6. A protective coating in accordance with claim 1, wherein $0.01 \leq g \leq 0.06$.

7. A protective coating in accordance with claim 1, wherein $0.03 \leq l \leq 0.10$.

8. A protective coating in accordance with claim 1, wherein $0.05 \leq m \leq 0.10$.

9. A protective coating in accordance with claim 1, wherein a free carbon C—C bonding is present in the hard coating.

10. A protective coating in accordance with claim 1, wherein a C—H bonding is present in the hard coating.

11. A protective coating in accordance with claim 1, wherein the hard coating has a hardness of at least 1000 Hv to 4000 Hv.

12. A protective coating in accordance with claim 1, wherein the hard coating has a hardness of at least 1500 to 3500 Hv.

13. A protective coating in accordance with claim 1, wherein a residual stress of the hard coating is between −0.5 to −3.5 GPa.

14. A protective coating in accordance with claim 1, wherein the coating includes at least 2 single layers with the elements $C_aSi_bB_dN_eO_gH_lMe_m$ alternating with at least one single layer of traditional hard coatings.

15. A coated member having a protective coating in accordance with claim 1.

16. A coated member, wherein a multilayer film is provided on a surface of the member, the multilayer film comprising at least a hard film (A) and a hard film (B) of different composition, wherein the hard film (A) is the low friction carbon containing hard coating in accordance with claim 1 being provided as the outermost layer of the multilayer film of the coated member.

17. A coated member in accordance with claim 16, wherein an additional layer is provided, the composition of which is represented by $Si_bB_dCaNeOg$ that satisfies $a+b+d+e+g=1$, $0.10 \leq b \leq 0.35$, $0.01 \leq d \leq 0.25$, $0.45 \leq a \leq 0.85$, $0.03 \leq e \leq 0.30$, and $0 < g \leq 0.20$, and the hard film B of an underlying layer below the hard film A comprises at least two metal ingredients selected from Al, Ti, Cr, Nb, W, Si, V, Zr and Mo, Mg, Co, Ni, Ce, Y, La, Sc, Pr, and at least one non-metallic ingredient selected from N, B, C, O and S.

18. A coated member in accordance with claim 15, wherein the coated member is a cutting tool, a mold, a forming tool, an engine parts, a component of an internal combustion engine, or a component of a gas turbine.

19. A method for producing a protective coating in accordance to claim 1, comprising depositing the protective coating on a substrate.

20. A method in accordance with claim 19, wherein the depositing the protective coating on a substrate comprises depositing with a PVD-method.

21. A method in accordance with claim 19, wherein the depositing the protective coating on a substrate comprises depositing with a RF magnetron sputtering method.

22. A method in accordance with claim 19, wherein the depositing the protective coating on a substrate comprises depositing with a DC sputtering or a pulsed DC sputtering method.

23. A method in accordance with claim 19, wherein the depositing the protective coating on a substrate comprises depositing with a High Power Pulsed Magnetron Sputtering method.

24. A method in accordance with claim 19, wherein the depositing the protective coating on a substrate comprises depositing using a composite target with a RF sputtering method.

25. A method in accordance with claim 19, wherein the depositing the protective coating on a substrate includes using a carbon comprising target with inserts made of SiC, $B_4C$.

26. A method in accordance with claim 19, wherein the depositing the protective coating on a substrate includes using a reactive gas comprising nitrogen.

27. A method in accordance with claim 19, wherein the depositing the protective coating on a substrate includes using a reactive gas comprising a carbon containing gas.

28. A method in accordance with claim 19, wherein the depositing the protective coating on a substrate includes using a reactive gas comprising a carbon containing gas and nitrogen.

29. A method in accordance with claim 19, wherein the depositing the protective coating on a substrate comprises depositing with an arc evaporation method.

30. A method in accordance with claim 19, wherein the depositing the protective coating on a substrate includes using a carbon cathode alloyed with Si and boron.

31. A method in accordance with claim 19, wherein the depositing the protective coating on a substrate includes using a reactive gas.

32. A method in accordance with claim 19, wherein the depositing the protective coating on a substrate comprises depositing with a CVD method.

33. A method in accordance with claim 19, wherein the depositing the protective coating on a substrate comprises depositing with a PE-CVD method using a precursor comprising at least carbon, silicon and boron.

34. A method in accordance with claim 24, wherein the composite target comprises SiC/BN mixtures.

* * * * *